United States Patent [19]
Havens

[11] 4,016,507
[45] Apr. 5, 1977

[54] SOLID STATE MICROWAVE OSCILLATOR USING COUPLED TEM TRANSMISSION LINES

[75] Inventor: Richard Calvin Havens, Scottsdale, Ariz.

[73] Assignee: Motorola, Inc., Chicago, Ill.

[22] Filed: May 11, 1976

[21] Appl. No.: 685,225

[52] U.S. Cl. .................................. 331/96; 331/101; 331/107 R; 331/107 G

[51] Int. Cl.² ...................... H03B 7/14; H03B 9/12

[58] Field of Search ........ 331/96, 101, 102, 107 R, 331/107 G, 117 D

[56] References Cited
UNITED STATES PATENTS 3,534,293  10/1970  Harkless ........................ 331/96 X
3,792,375  2/1974  Brackett ..................... 331/107 R X
3,913,035  10/1975  Havens ............................. 331/96 X Primary Examiner—Siegfried H. Grimm
Attorney, Agent, or Firm—Eugene A. Parsons

[57] ABSTRACT

A Transverse Electromagnetic Field (TEM) transmission line or lines with a negative impedance semiconductor device at one end and a lossy radio frequency (RF) load impedance at the other end, a TEM resonant transmission line with output power coupled therefrom, and an opening for coupling energy from the TEM transmission line or lines to the TEM resonant transmission line at the desired frequency with the Q of the oscillator being determined by the amount of coupling provided.

9 Claims, 7 Drawing Figures

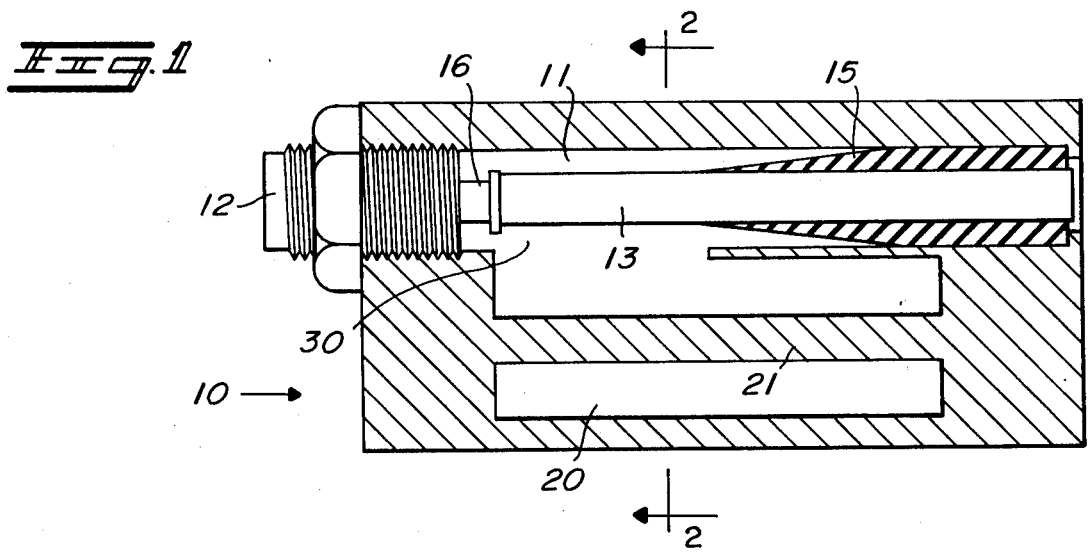
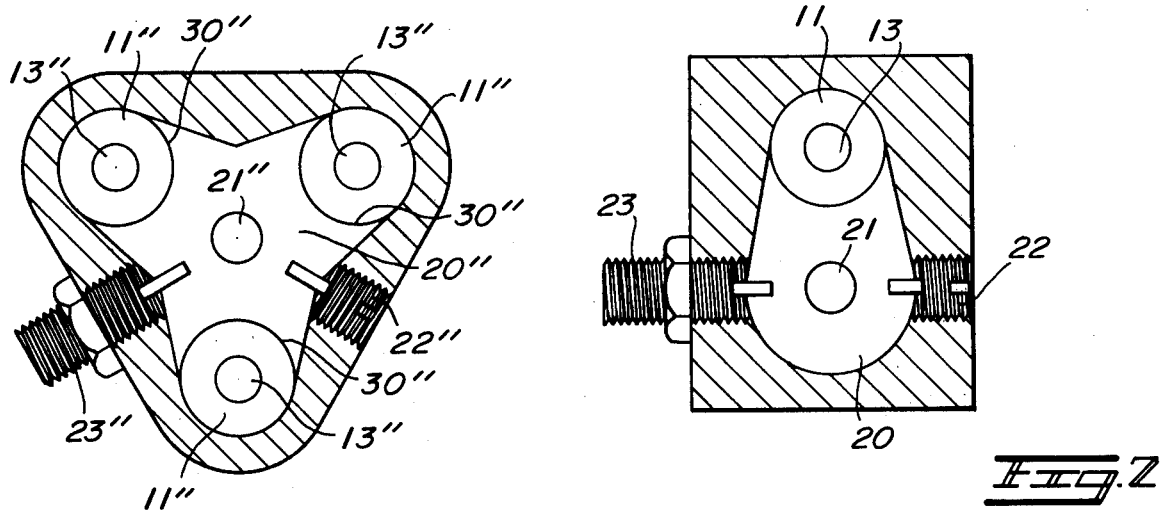
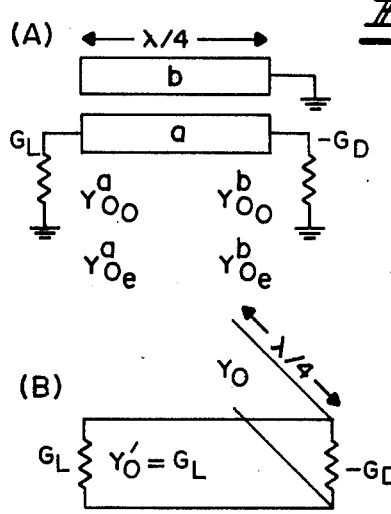
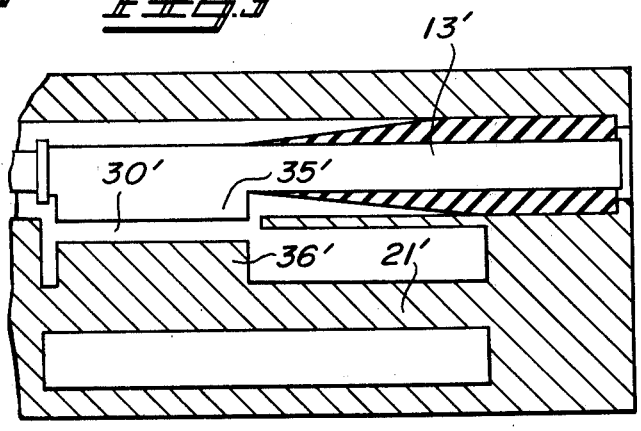

SOLID STATE MICROWAVE OSCILLATOR USING COUPLED TEM TRANSMISSION LINES

BACKGROUND OF THE INVENTION

This invention pertains to oscillator circuits generally referred to as solid state microwave oscillators, and more particularly, to oscillator circuits using negative impedance semiconductor devices. A negative impedance oscillator basically comprises a negative impedance device connected through a resonator, tuned to the desired frequency, to a load. The impedance presented by the cavity and load to the device is the complex conjugate of the negative impedance device. Typical examples of negative impedance devices used for generating microwave oscillations are the transistor, IMPATT diode, GUNN-Effect diode, tunnel diode and LSA diode, etc. With the possible exception of the GUNN effect diode, these devices all require that energy be fed back to the input terminals in sychronism with the RF voltage across the diode to maintain continuous oscillation. Unfortunately, even when design precautions are taken, frequencies other than the desired frequency may be generated causing frequency instability.

Prior art microwave oscillators, generally have a low Q, moding or oscillations at frequencies other than the one desired, and/or power loss due to other than optimum load impedance for the negative impedance device. Also, in prior art microwave oscillators it is generally impossible to raise the Q through a redesign of the various circuit parameters without seriously affecting the power output or optimum load impedance. In most prior art microwave oscillators all of these three features interact and changing one of them adversely affects the other two.

Two typical prior art devices are disclosed in U.S. Pat. Nos. 3,628,171, entitled "Microwave Power Combining Oscillator Circuits," issued Dec. 14, 1971, and 3,931,587, entitled "Microwave Power Accumulator," issued Jan. 6, 1976. Both of these devices use wave guide as a resonant cavity for accumulating or combining power. Becuase of the wave guide resonant cavity, these structures are larger and more expensive. Also, in U.S. Pat. No. 3,931,587, the power must be removed by means of a central probe. In addition it is difficult to obtain tight coupling between the transmission lines and the wave guide resonant cavity so that transformers are required.

SUMMARY OF THE INVENTION

The present invention pertains to a solid state microwave oscillator including a TEM transmission line with a negative impedance semiconductor device at one end and a lossy RF impedance at the other end, a TEM (coaxial for example) resonant transmission line and an opening for coupling energy from the TEM, transmission line to the TEM resonant transmission line at the desired frequency with the Q of the oscillator being determined by the amount of coupling provided. The Q of the present oscillator can be set at any desired value by simply changing the coupling between the TEM transmission line and the TEM resonant transmission line with decreased coupling increasing the Q. This design allows the Q of the oscillator to be predetermined and set to a particular value while simultaneously maintaining the optimum load impedance for the negative impedance device and preventing moding. Adjusting the power output coupling of the TEM resonant transmission line simultaneously assures optimum load impedance for the negative impedance device and theoretically maximum power output for the Q selected. In higher values of oscillator Q more power output is obtained than for previous conventional oscillator designs.

It is an object of the present invention to provide a new and improved solid state microwave oscillator.

It is a further object of the present invention to provide a solid state oscillator which can be designed with a desired Q while simultaneously maintaining the optimum load impedance for maximum power output and preventing moding.

It is a further object of the present invention to provide a solid state oscillator wherein the Q of the oscillator is determined by the amount of coupling provided between a TEM transmission line and a TEM resonant transmission line therein.

It is a further object of the present invention to provide a solid state oscillator wherein power from a plurality of TEM transmission lines is combined and easily removed from a single TEM resonant transmission line.

These and other objects of this invention will become apparent to those skilled in the art upon consideration of the accompanying specification, claims and drawing.

BRIEF DESCRIPTION OF THE DRAWINGS

Referring to the drawings, wherein like characters indicate like parts throughout the figures:

FIG. 1 is a view in cross section of a solid state microwave oscillator embodying the present invention;

FIG. 2 is a cross sectional view as seen from line 2—2 in FIG. 1;

FIG. 3 is a view similar to FIG. 1 with increased coupling between portions thereof;

FIG. 4 is a view similar to FIG. 2 of another embodiment, portions thereof removed; and FIG. 5(a) and (b) illustrate an equivalent circuit of an oscillator embodying the present invention and an identical transmission line equivalent circuit.

DESCRIPTION OF THE PREFERRED EMBODIMENT

Referring specifically to FIGS. 1 and 2, the numeral 10 generally designates a housing defining a first elongated opening or cavity 11 which extends from one end of the housing 10 to the other. A plug 12 is threadedly engaged in the housing 10 in one end of the opening 11 to seal the one end of the opening 11. An elongated center conductor 13 is constructed with a lossy load (for example a matched RF load impedance) 15 affixed thereto adjacent one end and a negative impedance semiconductor device 16 electrically and mechanically connected to the other end. The conductor 13 is positioned within the opening 11 with the negative impedance semiconductor device 16 electrically and mechanically connected to the plug 12 and the RF load impedance 15 maintaining the opposite end of the center conductor 13 in the proper position. The end of the elongated center conductor 13 having the RF load impedance 15 affixed thereto is accessible from the outside of the housing 10 so that a DC bias input may be applied thereto to energize the oscillator. In the present embodiment the opening 11 has a generally circular cross section and the center conductor 13 has a generally circular cross section so that the two cooperate to form a TEM transmission line, but it should be understood that any TEM transmission line, i.e. microstrip, stripline, coaxial transmission line, etc. might be utilized. The TEM transmission line is terminated on the one end by the negative impedance semiconductor device, which in this embodiment is illustrated as a negative resistance diode, but it should be understood that the negative impedance semiconductor device may be any semiconductor device, such as a transistor, a GUNN diode, an IMPATT diode, an LSA diode, or any combination of the above which will provide the required negative impedance to sustain oscillations.

A second elongated cavity 20 is defined in the housing 10 generally parallel with and spaced from the first opening or cavity 11. The second cavity 20 is formed with a fixed center conductor 21 extending the length thereof and generally coaxial with the cavity 20. The cavity 20 and center conductor 21 form a TEM resonant transmission line (coaxial) which is resonant at or near the desired frequency of oscillation of the oscillator. In the present embodiment the center conductor 21 is formed one-half wavelength long, but it should be understood that the resonant TEM transmission line might be formed any whole integer multiple of one-quarter wavelength, or any other desired length which will render the cavity resonant at the desired frequency. It will be understood by those skilled in the art that to make the TEM transmission line resonant when it is an odd multiple of a quarter wavelength one end must be open and the other end shorted whereas when it is an even multiple of a quarter wavelength both ends should either be shorted or open. Also, it should be understood, that the TEM resonant transmission line may be any of the well known TEM transmission lines, i.e. microstrip, stripline, coaxial, transmission lines, etc. An opening is formed through the housing 10 into the cavity 20 and a tuning screw 22 is threadedly engaged therein, which tuning screw has a sapphire rod extending from the inner end thereof into the cavity 20 for frequency tuning the resonator. This tuner could be of any other type, i.e. metal, etc. A second opening is formed through the housing 10 into the cavity 20 and a coaxial probe coupled power output plug 23 is threadedly engaged therein, in this embodiment, although it should be understood that this output coupling could be any of the well known types, i.e. loops, etc. Thus, the oscillator power output is removed from the cavity 20 by way of the plug 23.

An internal opening 30 is defined in the housing 10 between the first opening or cavity 11 and the second cavity 20. The opening 30 couples energy at the desired frequency from the TEM transmission line, opening 11 and center conductor 13, to the TEM resonant transmission line, cavity 20 and center conductor 21. In the present embodiment the opening 30 is one-quarter wavelength long at the desired oscillator frequency. This length provides maximum coupling. Less coupling is achieved by making the coupling length either longer or shorter, one-half wavelength will be minimum coupling while three-quarters wavelength will again approach maximum coupling, etc. Because the cavity 20 is a TEM resonant transmission line, much greater coupling can be achieved between the TEM transmission line and the TEM resonant transmission line than can be achieved with previous structures which use a waveguide instead of a TEM resonant transmission line. This means that quarter wave transformers are not required in the TEM transmission line as is the case in previous art. This improvment decreases size and improves efficiency. Any other generated frequencies travel along the TEM transmission line and are dissipated in the lossy RF load 15. Thus, moding, or oscillations at frequencies other than the one desired, are prevented. Becasue the TEM resonant transmission line can be made to appear as a very low impedance to the diode 16, almost all of the available power at the desired frequency is coupled to the TEM resonant transmission line and the output probe 23 is simply adjusted for maximum power output. It should be understood that the entire housing 10 may be constructed of electrical conducting material and/or the inner surfaces of the cavities and openings and the center conductors may be coated with a good electrical conductor to provide the desired electrical conductivity.

In addition it may be desirable to add or subtract a short length of transmission line between the diode and the beginning of the coupling area 30 in order to cancel the reactance of the diode and present a pure negative resistance at this point. The short negative or positive length of transmission line is utilized so that the oscillator operates at the resonant frequency of the TEM resonator. This is desirable so that the load conductance does not vary as fast versus frequency. In other words, under these conditions the mechanical tuning bandwidth is increased and both frequency and power variations due to diode perturbations from temperature, etc. are reduced.

The coaxial transmission line has both an even mode and an odd mode characteristic impedance associated with it. Ideally, the even mode impedance is adjusted to be optimum for preventing out of band oscillations and minimizing losses in the RF termination. This prevents moding or oscillations at frequencies other than the one desired, as already discussed. The odd mode impedance is adjusted to give the coupling required for the desired oscillator Q. The coupling is reduced to raise the oscillator Q and increased to lower the oscillator Q. The coupling between the TEM transmission line and the TEM resonant transmission line is determined by the size and shape of the opening 30 as well as, in the present embodiment, the distance between the TEM transmission line center conductor and the TEM resonant transmission line center conductor. The oscillator can be designed with a predetermined coupling between the TEM transmission line and the TEM resonant transmission line to provide the desired Q or the coupling can be adjusted by trial and error until the desired Q is obtained. Since the circuit as seen from the location of the negative impedance semiconductor device 16 is exactly that of a conventional band reject filter, except for the fact that the resonantor has an additional output coupling port 23 and bias is brought in through the RF lossy load, modern filter theory can be utilized to determine or synthesize the Q of the oscillator.

Referring to FIG. 3, an embodiment of the oscillator with a somewhat increased inter transmission line coupling is illustrated, whereby the Q of the oscillator is reduced. In the structure of FIG. 3 similar parts are designated with similar numbers and a prime is added to indicate a different embodiment. In the embodiment illustrated in FIG. 3 the coupling is increased by providing a projection 35' on the center conductor 13' of the TEM transmission line, which projection 35' extends into the opening 30'. A similar projection 36' is provided on the center conductor 21' of the TEM resonant transmission line which projection 36' extends into the opening 30' from the opposite side thereof. Thus, because of the projections 35' and 36' extending toward each other through the opening 30', the coupling between the TEM transmission line and the TEM resonant transmission line is increased and the Q of the oscillator is reduced. Through this example it can be seen that the coupling between the TEM transmission line and the TEM resonant transmission line can be designed to be any predetermined amount so that the Q can be any desired value.

Referring to FIG. 4, another embodiment of the solid state oscillator is illustrated wherein similar parts are designated with similar numbers and a double prime is added to indicate a different embodiment. In FIG. 4 a plurality of TEM transmission lines are formed by a plurality of cavities 11" and a plurality of center conductors 13". Each of the TEM transmission lines are coupled to a centrally located TEM resonant transmission line, including a cavity 20" and a center conductor 21", by coupling means, openings 30". The power is removed from the resonant transmission line 20" and 21" by an output coupling port 23". Thus, the TEM resonant transmission line can combine power from a plurality of TEM transmission lines each terminated in a negative impedance device at one end and a lossy impedance at the other end when additional power is required.

FIG. 5(a) illustrates a coupled TEM transmission line equivalent circuit as embodied in the present invention and FIG. 5(b) illustrates an identical transmission line equivalent circuit. It will be apparent to those skilled in the art that FIG. 5(b) illustrates an equivalent circuit which is desirable but nearly or completely impossible to construct. Whereas, FIG. 5(a) illustrates an equivalent circuit of the structure embodying the present invention which provides identical functions of the circuit of FIG. 5(b), but can be constructed with relative ease in accordance with the present invention. The design equations for the circuits of FIG. 5 are as follows.

$$1/Q_L = 1/Q_u + 1/Q_{ext}$$

$$G_{in} = \frac{|G_D| - G_L}{n}$$

$$Y_0 = \frac{\pi G_{in}}{4 Q_L}$$

$$C_{ab} = \frac{1 + \sqrt{1 + \frac{4 C_b}{Y_0 Z_0}}}{\frac{2}{Y_0 Z_0}}$$

$$C_a = z_0 (G_L + Y_0) - C_{ab}$$

$$Y_{0_o}^a = v(C_a + 2C_{ab})$$

$$Y_{0_o}^b = v(C_b + 2C_{ab})$$

$$Y_{0_e}^a = vC_a$$

$$Y_{0_e}^b = vC_b$$

wherein the characters are defined as follows:

$z_o$ = characteristic impedance of free space
$Q_u$ = unloaded Q of TEM resonator
$Q_{ext}$ = desired oscillator external Q
$|G_D|$ = absolute value of diode parallel equivalent negative conductance
$G_L$ = TEM transmission line RF termination
$n$ = the number of diodes to be combined
$C_{ab}$ = Capacitance per unit length between line a and line b
$C_a$ = Capacitance per unit length of line a
$v$ = velocity of light in free space
$Y_{0_o}^a$ = odd mode characteristic admittance of line a
$Y_{0_o}^b$ = odd mode characteristic admittance of line b
$Y_{0_e}^a$ = Even mode characteristic admittance of line a -continued $C_b$ = capacitance per unit length of line b
$Y_{0_e}^b$ = Even mode characteristic admittance of line b Thus, a solid state oscillator is disclosed utilizing one or more TEM transmission lines each terminated in a negative impedance semiconductor device at one end and a lossy impedance at the other end with a TEM resonant transmission, line coupled thereto. The TEM resonant transmission line modified slightly by the loaded TEM line, appears as the complex conjugate of the negative impedance semiconductor device or devices and the Q of the oscillator is dependent upon the coupling between the TEM transmission line or lines and the TEM resonant transmission line. Thus this design allows the Q of an oscillator to be raised and set to a particular value while simultaneously maintaining the optimum load impedance for the negative device and preventing moding. These three features, high Q, optimum load impedance for maximum power output, and freedom from moding, can not be deliberately obtained from most previous conventional oscillators.

While I have shown and described specific embodiments of this invention, further modifications and improvements will occur to those skilled in the art. I desire to be understood, therefore, that this invention is not limited to the particular forms shown and I intend in the appended claims to cover all modifications which do not depart from the spirit and scope of this invention.

I claim:
1. A solid state oscillator comprising:
   a. a TEM transmission line;
   b. a negative impedance semiconductor device connected at one end of said TEM transmission line for generating oscillations;
   c. a lossy impedance connected to the other end of said TEM transmission line;
   d. a TEM resonant transmission line with means for removing RF power therefrom; and
   e. coupling means for coupling energy at a desired oscillation frequency from said TEM transmission line to said TEM resonant transmission line with the Q of the oscillator being determined by the amount of coupling.

2. A solid state oscillator as claimed in claim 1 wherein the length of the TEM resonant transmission line is a whole integer multiple of approximately one-quarter wave-length of the desired frequency.

3. A solid state oscillator as claimed in claim 1 wherein the coupling means includes an opening between the TEM transmission line and the TEM resonant transmission line which opening is approximately a quarter of a wavelength in length at the desired frequency.

4. A solid state oscillator as claimed in claim 1 wherein the other end of the TEM transmission line has an imput for a DC bias voltage to energize the oscillator.

5. A solid state oscillator as claimed in claim 1 including a plurality of TEM transmission lines, a plurality of negative impedance semiconductor devices each connected to one end of one of said TEM transmission lines and a plurality of lossy impedances each connected to the other end of one of said TEM transmission lines, with the coupling means coupling energy from each of said TEM transmission lines to the TEM resonant transmission line.

6. A solid state oscillator as claimed in claim 1 wherein the coupling means is positioned a short length from the negative impedance semiconductor device along the TEM transmission line, said short length being sufficient to substantially cancel any reactance of the semiconductor device and present a substantially pure negative resistance to the TEM resonant transmission line.

7. A solid state oscillator comprising:
   a. a housing defining therein a first elongated cavity, a second elongated cavity adjacent said first cavity and generally parallel thereto, and an opening connecting said first and second cavities, at least the walls of said first and second cavities and said opening having electrical conducting material thereon;
   b. an elongated center conductor;
   c. a negative impedance semiconductor device affixed to one end of said center conductor;
   d. a lossy impedance affixed to the other end of said center conductor;
   e. said semiconductor device and said lossy impedance affixing said center conductor within said first cavity to form said first cavity into a TEM transmission line; and
   f. an elongated center conductor fixedly mounted within said second cavity to form said second cavity into a TEM resonant transmission line at a desired frequency.

8. A solid state oscillator as claimed in claim 7 wherein the TEM transmission line has an input for a DC bias voltage to energize the oscillator at the other end thereof.

9. A solid state oscillator as claimed in claim 7 wherein the housing is constructed with a predetermined amount of coupling from the TEM transmission line to the resonant transmission line provided by the connecting opening there between to provide a desired oscillator Q.

* * * * *